(12) United States Patent
O'Donnell et al.

(10) Patent No.: US 11,665,840 B1
(45) Date of Patent: May 30, 2023

(54) INFORMATION HANDLING SYSTEM BEZEL SECURITY LATCH

(71) Applicant: Dell Products L.P., Round Rock, TX (US)

(72) Inventors: Sean P. O'Donnell, Poughkeepsie, NY (US); Richard W. Guzman, Lago Vista, TX (US); Richard A. Crisp, Austin, TX (US); Jean M. Doglio, Round Rock, TX (US); Peter Clark, Taiwan (TW); Kevin Keller, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/582,232

(22) Filed: Jan. 24, 2022

(51) Int. Cl.
*H05K 5/02* (2006.01)
*H05K 7/14* (2006.01)

(52) U.S. Cl.
CPC ......... *H05K 5/0221* (2013.01); *H05K 7/1409* (2013.01); *H05K 7/1489* (2013.01)

(58) Field of Classification Search
None
See application file for complete search history.

(56) References Cited

U.S. PATENT DOCUMENTS

| | | | |
|---|---|---|---|
| 7,974,092 B2* | 7/2011 | Zhang | G06F 1/181 361/679.58 |
| 9,125,050 B2 | 9/2015 | Taylor et al. | |
| 9,161,476 B2 | 10/2015 | Doglio et al. | |
| 10,111,355 B1* | 10/2018 | Marrs | H05K 5/0221 |
| 10,251,299 B1* | 4/2019 | Wang | E05C 9/026 |
| 11,412,633 B2* | 8/2022 | Zhong | H05K 5/0021 |
| 2004/0233619 A1* | 11/2004 | Heistand, II | G06F 1/181 361/679.57 |
| 2005/0179517 A1 | 8/2005 | Harms et al. | |
| 2011/0279973 A1* | 11/2011 | Terwilliger | H05K 7/1489 312/223.2 |
| 2013/0241377 A1* | 9/2013 | Zhang | G06F 1/181 403/188 |
| 2013/0241378 A1* | 9/2013 | Zhang | H05K 5/0221 403/327 |
| 2015/0062796 A1* | 3/2015 | Yu | H05K 5/0221 49/460 |

(Continued)

*Primary Examiner* — James Wu
*Assistant Examiner* — Christopher L Augustin
(74) *Attorney, Agent, or Firm* — Zagorin Cave LLP; Robert W. Holland

(57) ABSTRACT

A server information handling system couples to a rack and is secured with a security device coupled to one side of the information handling system housing clear of the front side of the information handling system so that the entire front side of the housing is available for venting and/or interface devices like a power switch and ports. The security device has a latch that moves vertically in response to an outward and upward pull on a lever engaged with the latch. The latch secures and releases the housing to the server rack, such as at the rail holding the housing in the rack, and releases a pin from a slot of a bezel that covers a front face of the server information handling system. The pin moves vertically in a channel of the latch and is biased to a locked position so that insertion of the server bezel onto the housing will lock the bezel with the pin while the lever remains in a locked position.

19 Claims, 9 Drawing Sheets

(56) References Cited

U.S. PATENT DOCUMENTS

| | | | | |
|---|---|---|---|---|
| 2015/0271935 A1* | 9/2015 | Zhang | ............ | H05K 7/1489 361/679.01 |
| 2019/0075666 A1* | 3/2019 | Ehlen | ............ | H05K 7/1487 |
| 2022/0334621 A1* | 10/2022 | O'Donnell | ............ | G06F 1/181 |

* cited by examiner

INFORMATION HANDLING SYSTEM BEZEL SECURITY LATCH

BACKGROUND OF THE INVENTION

Field of the Invention

The present invention relates in general to the field of information handling system security, and more particularly to an information handling system bezel security latch.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling system servers include processing components that coordinate communications with client information handling systems to perform a variety of functions. For example, server information handling systems at an enterprise location host email and data storage for the enterprise to enhance enterprise employee's ability to communicate and share enterprise data. Other enterprise servers might host an e-commerce hub through which customers perform purchases and other interactions with the enterprise. In some instances, server information handling systems are deployed in a cloud environment that has virtualized server resources executing over hardware hosts. For example, a cloud provider deploys multiple server information handling systems to a data center and then assigns virtual machines of customers to execute in the data center so that multiple customers share server resources on demand. In a cloud environment, each server information handling system may have applications and information of multiple different enterprises at the same time. Cloud virtualization secures the information from unauthorized network access, however, physical security is typically enforced that limits access to the physical server information handling systems to authorized information technology professionals of the data center.

A typical data center deploys plural information handling systems in each of plural server racks that are placed in a specialized area to receive cooling air flow and regulated power. A typical server rack has plural server information handling systems vertically stacked and mounted by rails that allow the server information handling systems to slide out for maintenance and replacement. A typical data center deployment will direct cooling airflow to the server information handling system front face where internal cooling fans draw the cooling airflow through vents of the front face and out the rear face of the system. In addition, a typical server information handling system deployment exposes ports and cable connections at the front and/or rear face of the server information handling system so that information technology professionals can interact with the system and so that the system can interface with a network, peripherals and other systems.

Generally, to prevent unauthorized physical interactions with server information handling systems of a server rack, each server information handling system is coupled to the server rack by a lock, such as a keyed barrel lock. In addition, the front of the server typically has a secure bezel that restricts access to front controls of the server information handling system, such as power switches and ports. In such a configuration, an information technology professional can unlock the bezel to interact with the server information handling system and unlock the server rack to slide the server information handling system out external to the server rack where the interior components are accessible. One difficulty with this approach to security is that multiple locks are involved, which increases the cost and size of the server information handling system and the complexity of accessing the system. Another difficulty with this approach is that the lock and bezel security tend to interfere with the flow of cooling airflow into the front side of the server information handling system.

SUMMARY OF THE INVENTION

Therefore, a need has arisen for a system and method which consolidates information handling system server to rack security and bezel over housing security with minimal interference of a security device at a front face of the server information handling system.

In accordance with the present invention, a system and method are provided which substantially reduce the disadvantages and problems associated with previous methods and systems for securing a server information handling system at a server rack. A rail mount coupled at a side of a server information handling system engages with the server rack and with a server bezel so that an end user interaction with a single release lever provides access to bezel removal and separation of the information handling system from the rack.

More specifically, a server rack holds plural server information handlings coupled to rails that allow the server information handling system housings to extend from and retract into the rack. A bezel couples to the front face of each server information handling system to secure against unauthorized access of controls and ports. A security device couples at one side of the server information handling system housing to secure the housing to the rack and prevent extension of the housing from the rack, and to secure the bezel to the housing to prevent unauthorized access to the server information handling system front face. For example, the security device is included in a rail mount that extends with a dogear configuration to one side of the server information handling system housing, such as to support a user grasp for pulling on and extending the server information handling system from the rack. A release actuator lever exposed at the front of the rail mount extends out, such as with a lifting rotational movement, to actuate a latch included in the rail mount. The latch has a catch extending from a rear side to engage and release the housing from the rack, such as with a hook that engages and releases the rail coupling the server information handling system to the rack. The latch has one or more pins extending towards the server information handling system housing to engage in slots of the bezel. When the lever actuates the latch, the pins move vertically out of the slots to permit removal of the bezel. The pins mount in a channel of the latch with a biasing device biasing the pins to a locked position and providing pin movement to the unlocked position when a bezel slot cammed portion presses against the pin to couple the bezel to the server information handling system housing when the lever secures the latch to a locked position.

The present invention provides a number of important technical advantages. One example of an important technical advantage is that a single security device coupled to a side of a server information handling system housing manages secure access of both the server information handling system housing rail extension from the server rack and the security bezel coupled to the front face of the server information handling system housing. Combining both server rack and bezel security in a single release actuation improves system security with a more simple approach having a reduced cost. Offsetting the security device to a side of the server information handling system housing reduces any obstruction of the server information handling system housing front face, such as might reduce venting available to provide a cooling airflow to the server information handling system.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A server information handling system secures to a server rack and has a bezel secured to a front face by a single security device coupled to one side of the server information handling system housing. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
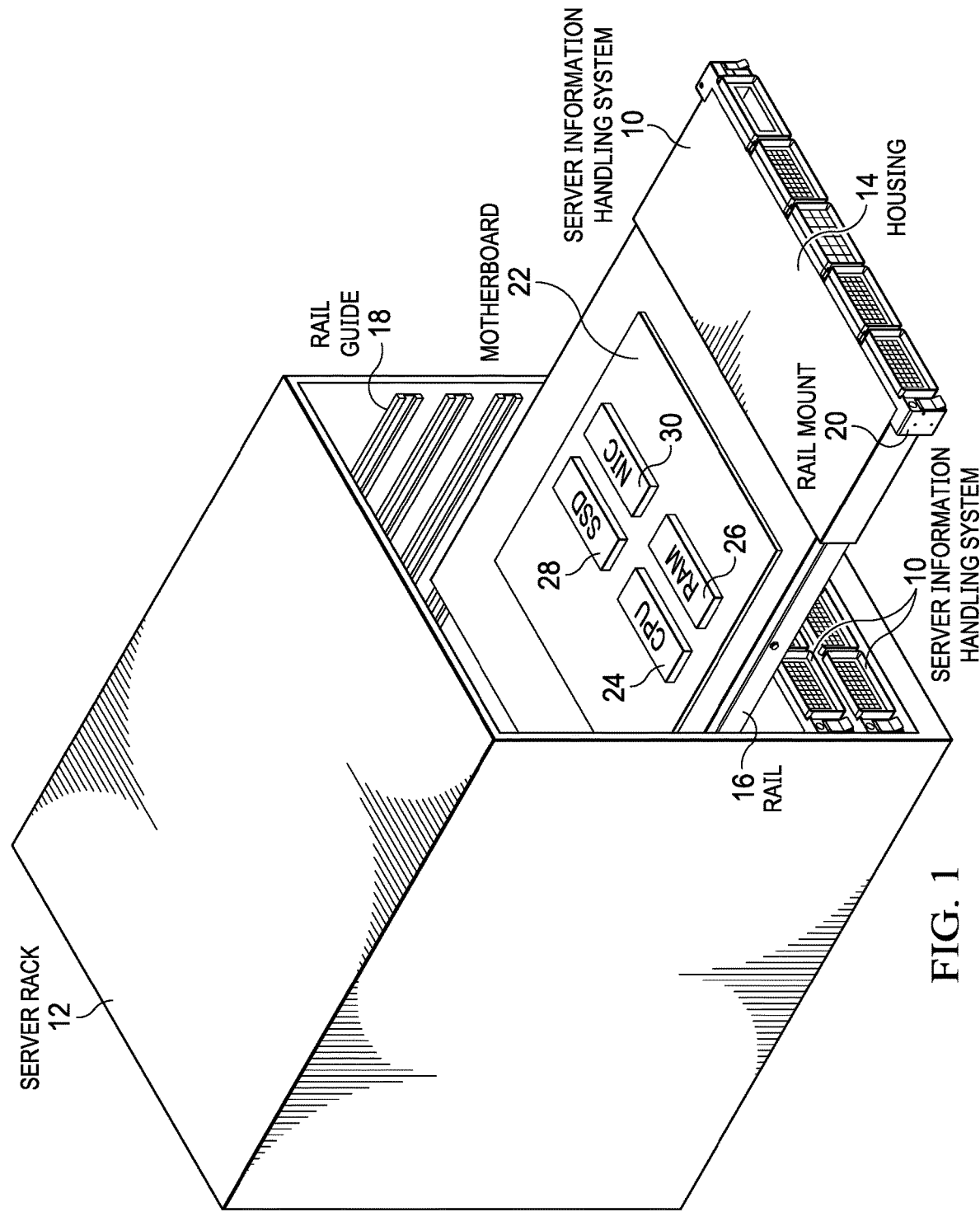
FIG. 1 depicts a server rack having plural server information handling systems that extend to offer access to a housing interior and retract to offer access at a housing front face.

Referring now to FIG. 1, a server rack 12 is depicted having plural server information handling systems 10 that extend to offer access to a housing 14 interior and retract to offer access at a housing front face. In the example embodiment, server rack 12 vertically stacks server information handling systems 10 by having rails 16 on each side of server information handling system housings 14 slidingly engage with rail guides 18 coupled to server rack 12. A wide variety of conventional rail and rail guide assemblies may be used in different types of server racks 12 to provide a retracted position of housing 14 within server rack 12 and an extended position outside of server rack 12. A rail mount 20 couples to the side of each server information handling system housing 14 to provide a structure that an end user can grasp to pull out and push in the housing. Rail mount 20 has a dogear configuration to extend outward from the housing and overlap the perimeter of server rack 12 and may or may not be part of the structure that couples rail 16 to housing 14. In the example embodiment, one server information handling system 10 has the housing 14 extended out from server rack 12 to provide access to processing components within housing 14 and interfaced by a motherboard 22. For instance, a central processing unit (CPU) 24 in housing 14 executes instructions to process information, such as a virtual device application to support execution of virtual machines. A random access memory (RAM) 26 stores the instructions and information in cooperation with execution by CPU 24. A solid state drive (SSD) 28 provides persistent storage of applications and information, such as during power down states. A network interface controller (NIC) 30 supports network communications for server information handling system 10, such as through Ethernet or other cable or wireless interfaces.

Figure 2A:
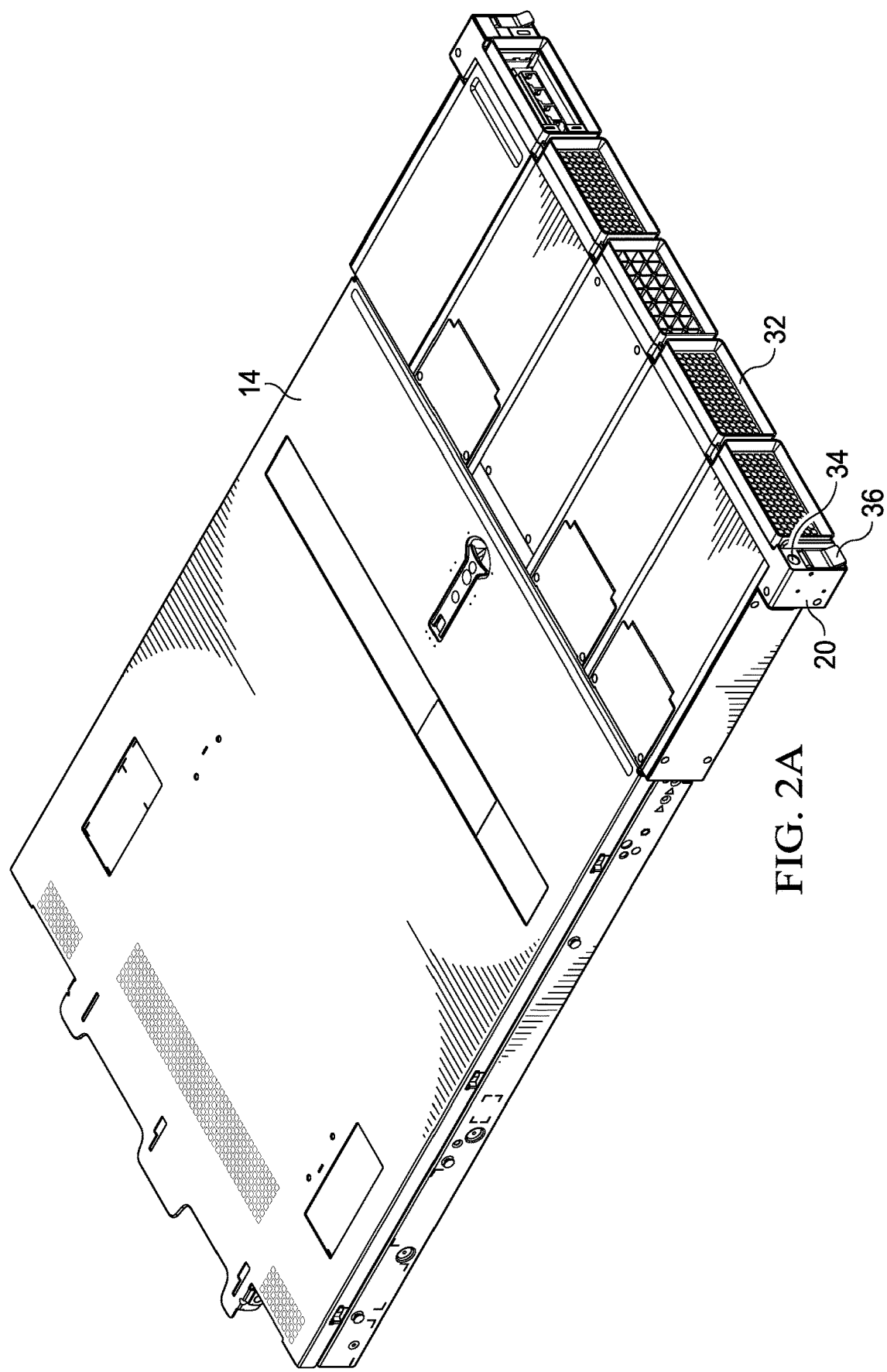
FIGS. 2A, 2B and 2C depict a server information handling system bezel to selectively secure the server information handling system front face.
Figure 2B:
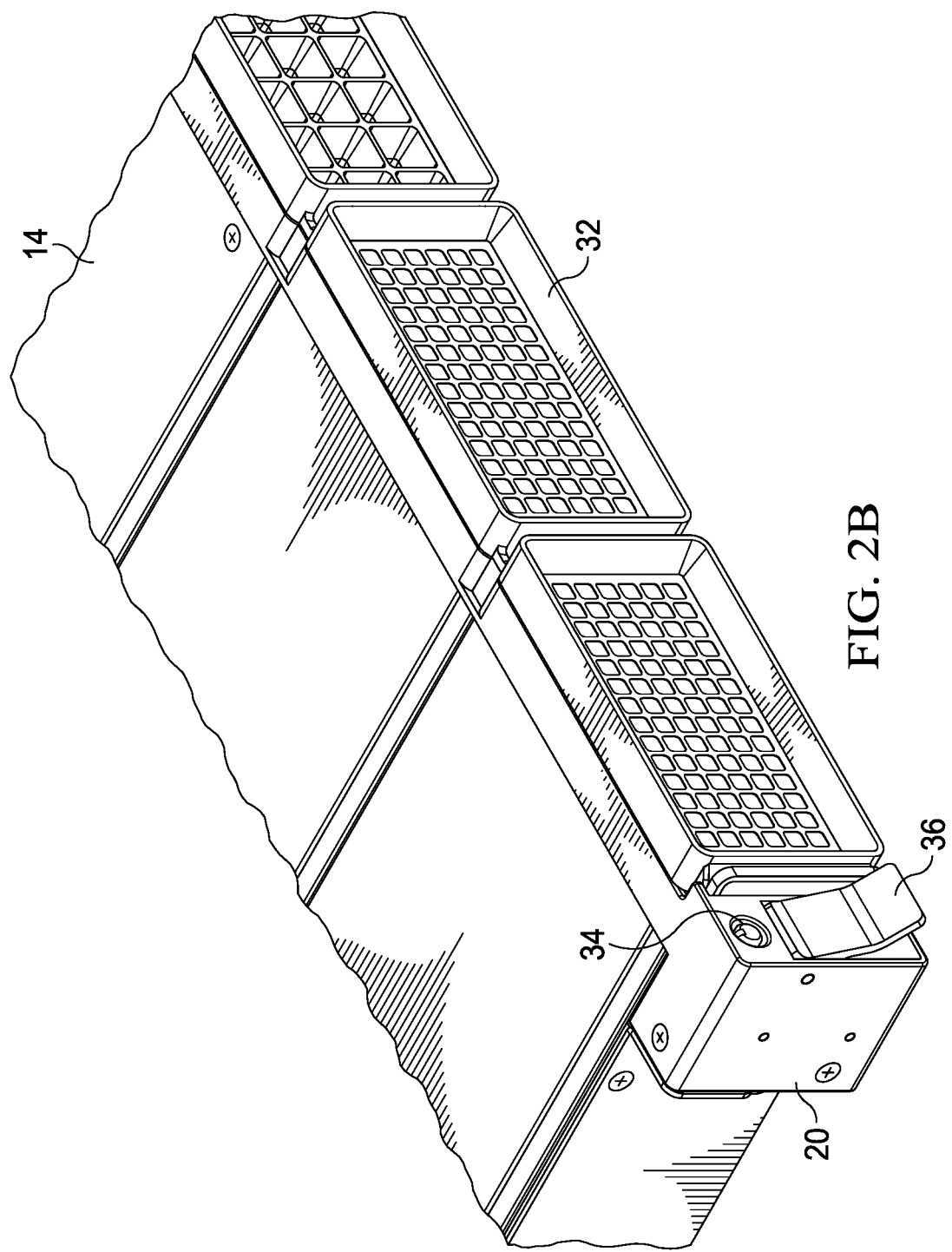
Figure 2C:
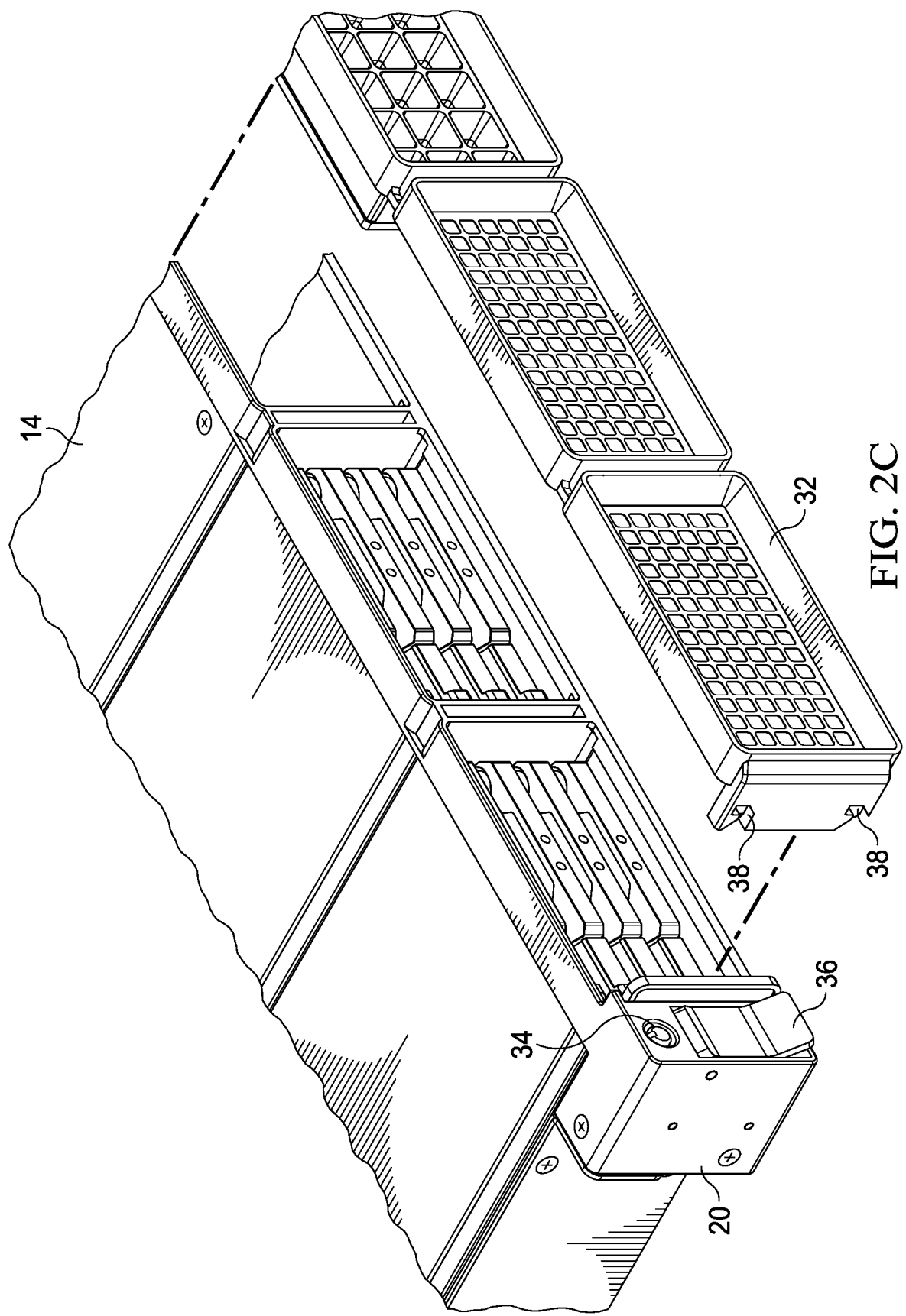

Referring now to FIGS. 2A, 2B and 2C, a server information handling system bezel 32 is depicted that selectively secures the server information handling system front face. FIG. 2A depicts server information handling system 10 removed from the server rack and having a bezel 32 coupled to the front face of housing 14 to secure access to the ports and interfaces exposed at the front face. Rail mount 20 extends out from the side of housing 14 with a dogear configuration that offers a place for an end user to grasp to pull out and push in housing 14 at a server rack. A lock 34 included in rail mount 20 secures a release actuator lever 36 from actuation, as is described in greater depth below. Lock 34 is, for instance, a keyed barrel lock that couples to rail mount 20 and prevents both separation of housing 14 from a retracted position in a server rack and removal of bezel 32 from the front face of housing 14. FIG. 2B depicts release actuation lever 36 actuated with an outward and upward movement to release the security device included in rail mount 20 and free bezel 32 for removal from housing 14. FIG. 2C depicts bezel 32 removed from housing 14 to expose slots 38 that engage the security device disposed in rail mount 20. In the example embodiment, two vertically stacked slots 38 are exposed that engage with two pins of the security device, as described in greater detail below. Each slot 38 has a lip shape at an interior or the slot that prevents removal of bezel 32 when the slot engages a security device pin. In addition, each slot has a cammed opening the works against the security device pin when bezel 32 presses into place against a locked security device.

Figure 3:
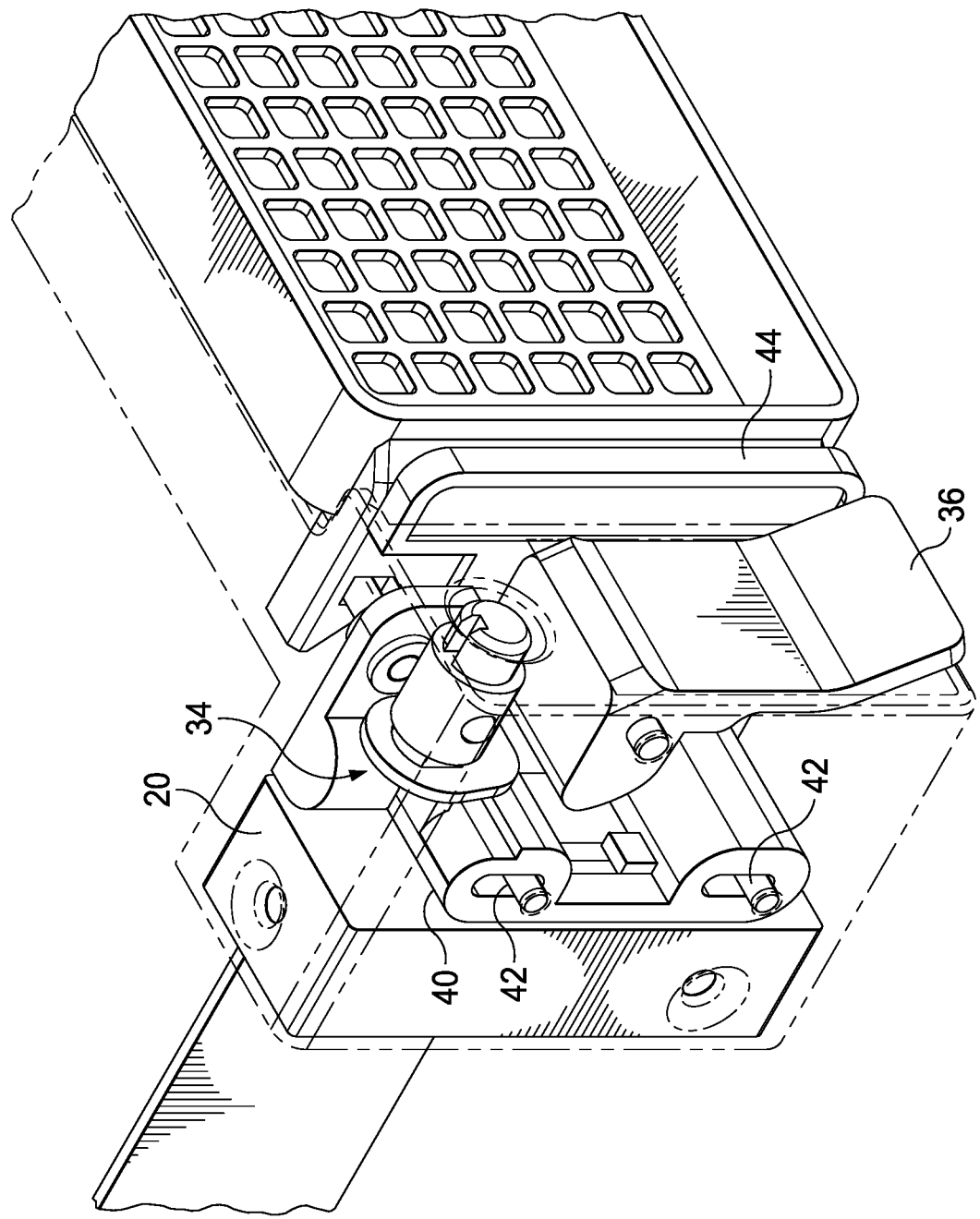
FIG. 3 depicts a side perspective view of security device coupled as a rail mount to the side of a server information handling system housing and securing both the server information handling system to the rack and the bezel to the server information handling system housing.

Referring now to FIG. 3, a side perspective view depicts a security device coupled as a rail mount 20 to the side of a server information handling system housing and securing both the server information handling system to the rack and the bezel to the server information handling system housing. In the example embodiment, release actuator lever 36 extends outward and upward from rail mount 20 to rotate about a rotation pivot and press an interior cam surface against a latch 40. Latch 40 is coupled within rail mount 20 to travel within vertical constraints based upon the position of the inner cam surface of release actuator lever 36. When release actuator lever 36 is pulled upward and outward from rail mount 20, latch 40 is pushed downward so that securing member pins 42 move downward and release the bezel by moving out of the slots of the bezel. When release actuator lever 36 is pushed down and against rail mount 20, latch 40 is pushed upward raising securing member pins 42 into the slots of the bezel to hold the bezel in position against the server information handling system housing. Although the example embodiment translates a release actuation lever rotation to latch 40 by an upward and outward pull on the lever, other types of translations of an actuation can be supported in alternative embodiments, such as a downward pull on the lever or a push button press. A lock 34 exposed at the front face of rail mount 20 secures latch 40 to rail mount 20 to prevent movement that releases the housing or bezel. In the example embodiment, lock 34 is a keyed barrel lock that is removed to free latch 40 to move. An information plate 44 is disposed between rail mount 20 and the server information handling system housing with an exposed handle that an end user can pull on to pull out and expose a surface of information plate 44. For example, a data card may couple to information plate 44 to have identification or operation information readily available for the server information handling system. In various embodiments, information plate 44 may move independent of the condition of lock 34, such as locked or unlocked, or may remain secured in place and hidden unless lock 34 is unlocked.

Figure 4:
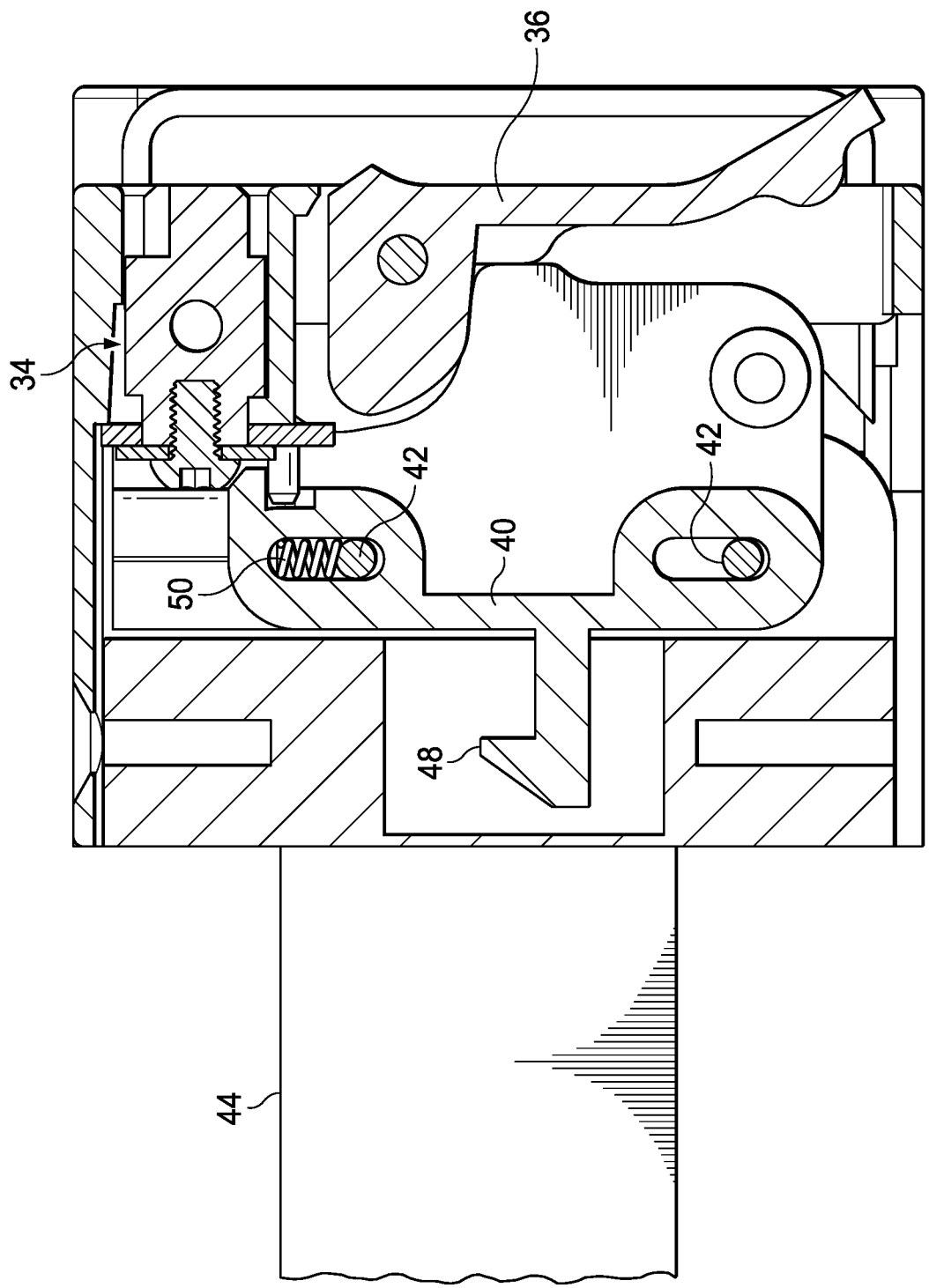
FIG. 4 depicts a side sectional view of the security device having a lever engaged with a latch to secure and release both the server information handling system at the rack and the bezel at the server information handling system front face.

Referring now to FIG. 4, a side sectional view depicts the security device having a lever 36 engaged with a latch 40 to secure and release both the server information handling system at the rack and the bezel at the server information handling system front face. In the example embodiment, a catch 48 extends from a rear side of latch 40 to raise and lower with latch 40 in response to movement of release actuator lever 36. For example, catch 48 has a hook that engages directly or indirectly with the server rack to prevent movement of the server information handling system when the hook is coupled in place. A spring 50 biases against securing member pins 42 to push securing member pins 42 towards the bottom of a channel formed latch 40. If a bezel is pressed into place at the front of a server information handling system, securing member pins 42 float upward against the bias of securing member pins 42 to engage the bezel slots and then bias downward after the bezel is secured to prevent removal of the bezel. Lock 34 couples to latch 40 to prevent vertical motion of latch 40, however, the motion of securing member pins 42 within the latch channels allows securing of the bezel to the housing when lock 34 is engaged.

Figure 5:
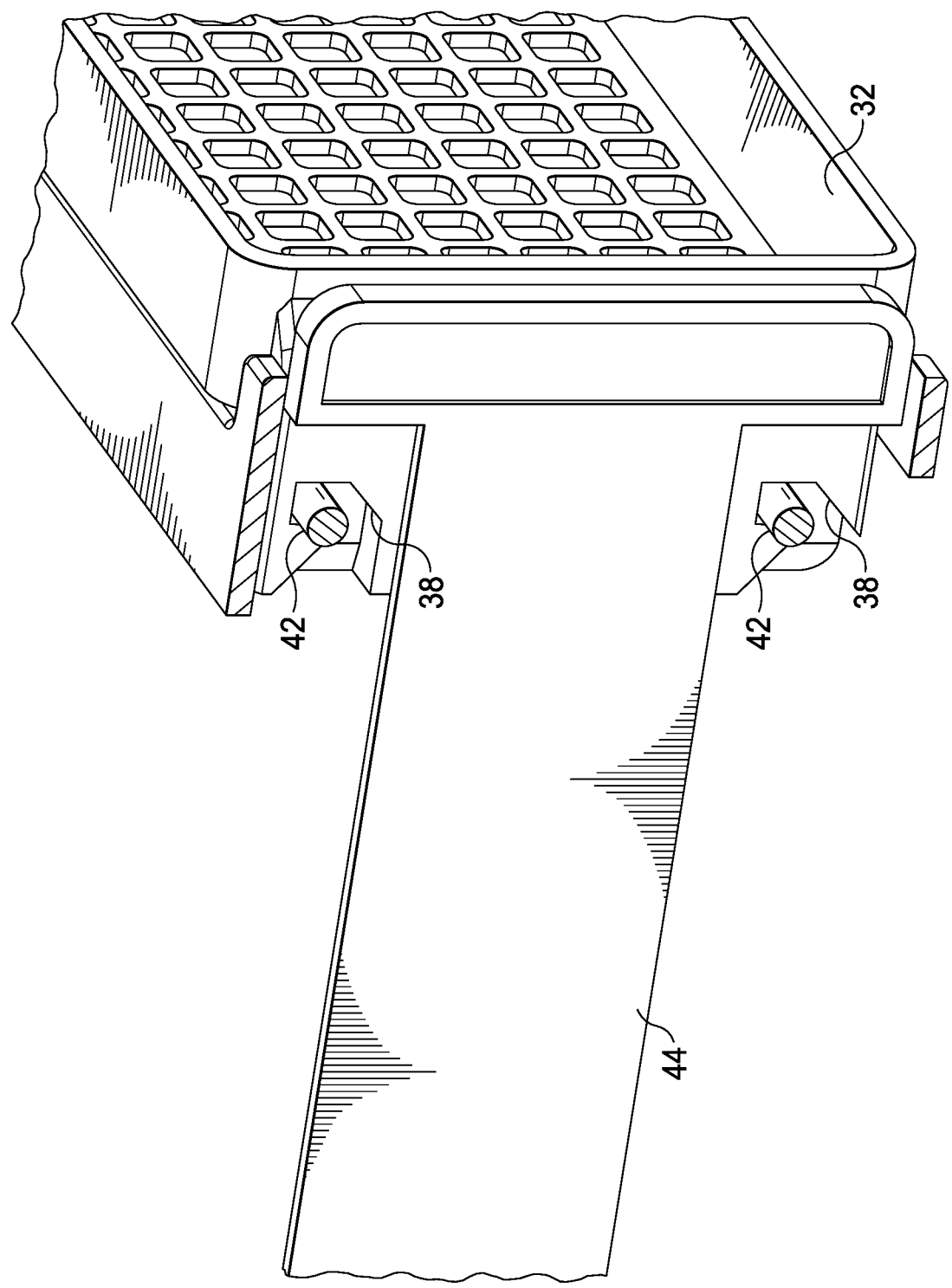
FIG. 5 depicts a side sectional view of a bezel coupled to a server information handling system housing with vertically stacked pins extending from a rail mount and arranged around an extendable information plate.

Referring now to FIG. 5, a side sectional view depicts a bezel 32 coupled to a server information handling system housing with vertically stacked pins 42 extending from a rail mount and arranged around an extendable information plate 44. Securing member pins 42 engage with slots 38 so that bezel 32 is secured in place unless the latch is lowered to remove securing member pins 42 from behind the lip formed by slots 38. The front cam face of slots 38 operate against the securing member pins to secure the bezel when the latch is in a locked position.

Figure 6A:
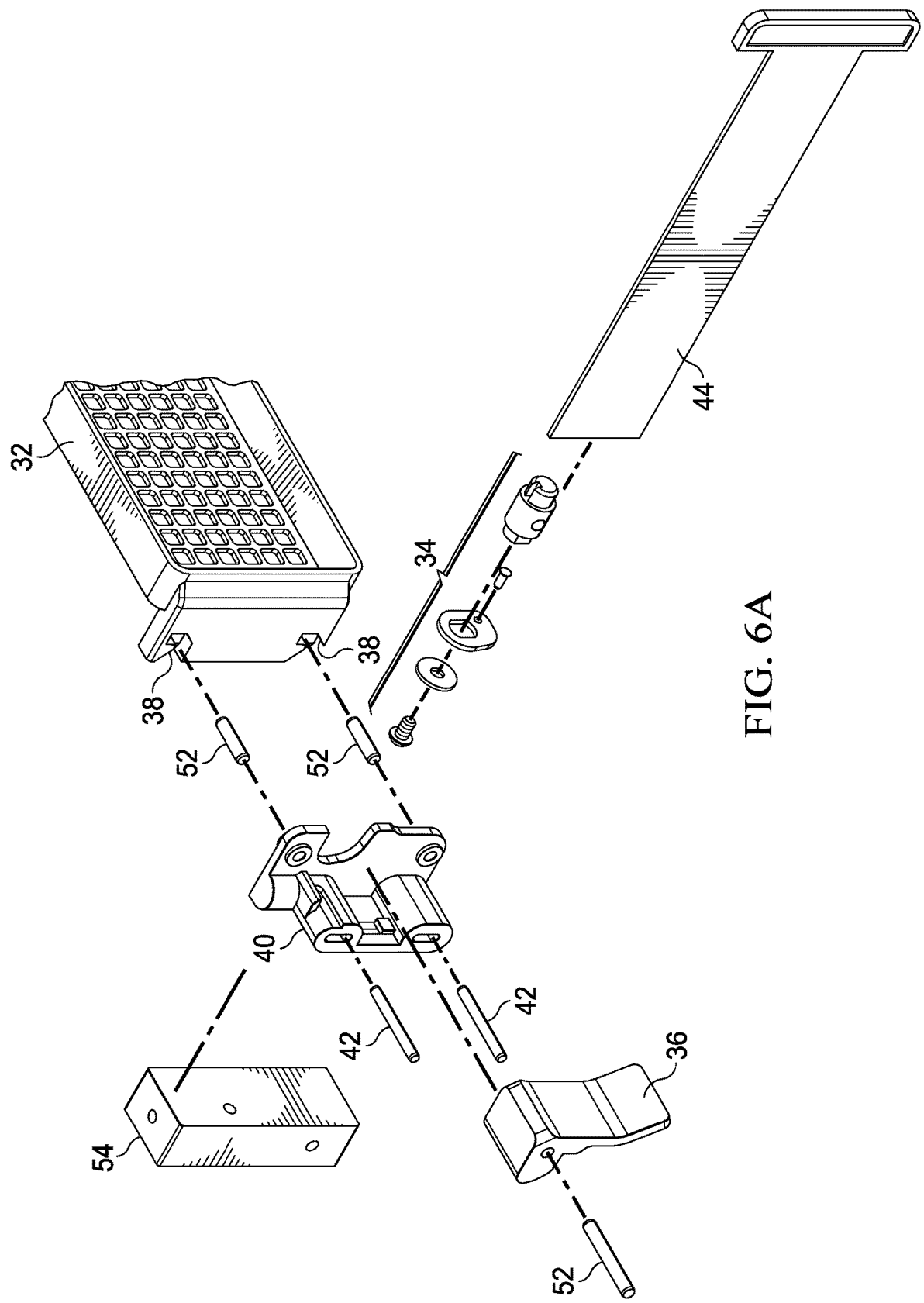
FIGS. 6A and 6B depict a perspective exploded view of the security device configured to secure a server information handling system to a server rack and a bezel to a front face of the server information handling system.
Figure 6B:
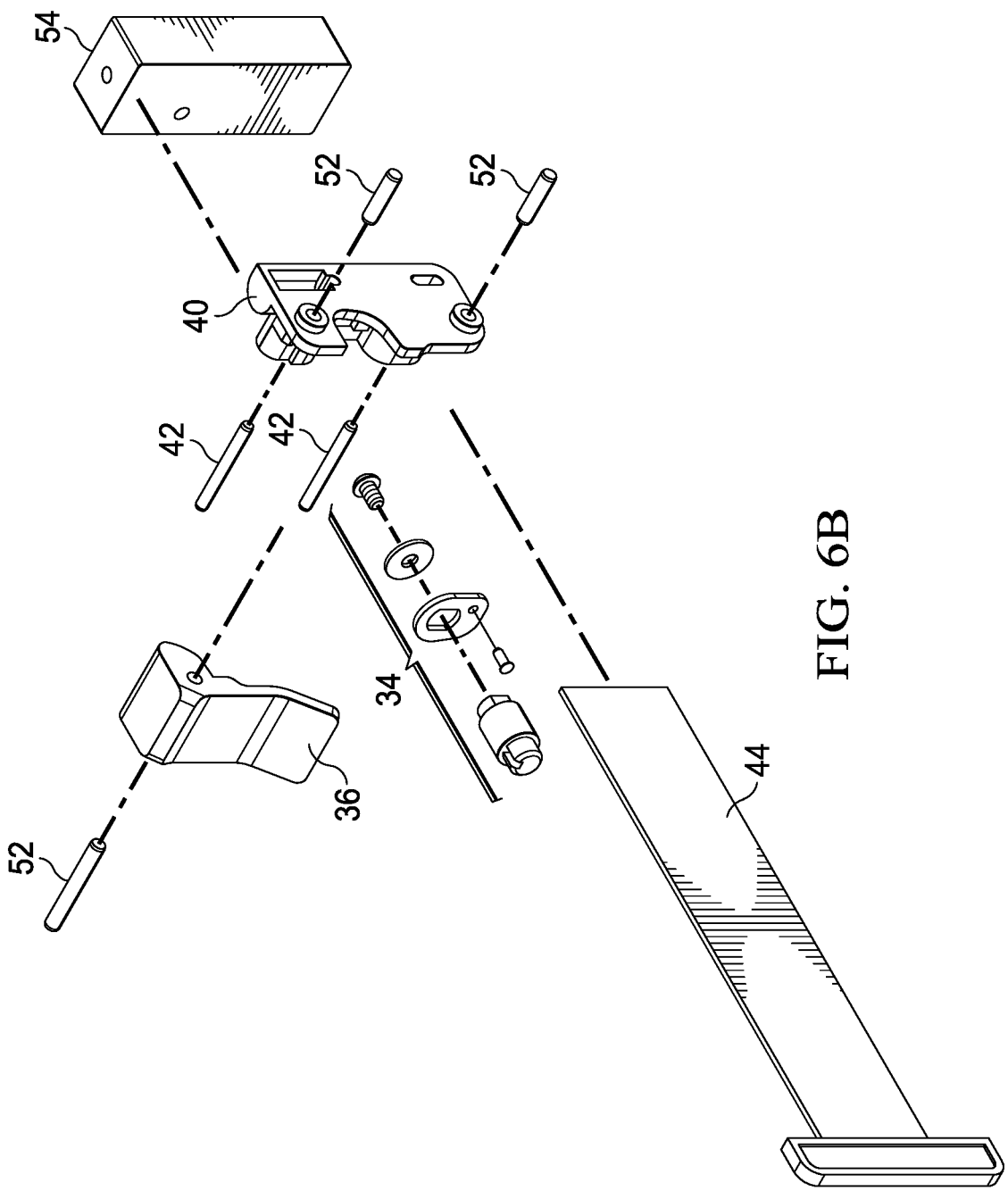

Referring now to FIGS. 6A and 6B, a perspective exploded view depicts the security device configured to secure a server information handling system to a server rack and a bezel to a front face of the server information handling system. Latch 40 presses against a back block 54 of the rail mount to slide vertically constrained by pivot pins 52. Release actuator lever 36 rotates about one pivot pin 52 to provide vertical up and down force operating against latch 40. Securing member pins 42 engage in channels of latch 40 to bias against an internal spring so that bezel 32 can secure into place when latch 40 is locked into place by lock 34. Vertically downward movement of latch 40 removes securing member pins 42 from slots 38 to release bezel 38. Information plate 44 slides in and out between latch 40 and bezel 32 to provide a data plate or other system information to an end user.

Although the present invention has been described in detail, it should be understood that various changes, substitutions and alterations can be made hereto without departing from the spirit and scope of the invention as defined by the appended claims.

What is claimed is:
1. An information handling system comprising:
   a housing having a front face and a rail configured to couple to a rack;
   a processor disposed in the housing and operable to execute instructions to process information;
   a memory disposed in the housing and interfaced with the processor, the memory operable to store the instructions and information;
   a rail mount coupled at each of opposing ends of the housing front face;
   a bezel sized to couple to the housing front face between the rail mounts, the bezel having a slot; and
   a security device coupled to the rail mount, the security device having a lever exposed at a front position of the rail mount and engaged with a latch, the latch having a catch configured to engage the rail and a pin extending towards the bezel to engage the bezel slot, the lever configured to actuate against the latch to release the catch at the rail and the bezel slot from the pin.
2. The information handling system of claim 1 further comprising:
   a lock exposed at the front position of the rail mount and engaged with the latch;

wherein the lock engages the latch to constrain latch movement and prevent release of the rail catch and the bezel pin.

3. The information handling system of claim 2 wherein the lock comprises a barrel lock secured by a key.

4. The information handling system of claim 2 wherein:
the lever raises upward and out from the front of the rail mount; and
a cam surface of the lever presses downward on the latch when the lever raises upward to move the catch and the bezel pin down.

5. The information handling system of claim 4 wherein the security device has first and second vertically configured bezel pins that engage first and second bezel slots.

6. The information handling system of claim 4 wherein the latch has a vertical slot that accepts the bezel pin and a spring that biases the bezel pin to a locked position, the bezel slot having a cam surface to engage against the bezel pin and overcome the spring bias to couple the bezel to the housing when the lock constrains latch movement.

7. The information handling system of claim 4 further comprising a product information tag member slidingly engaged between the housing and the rail mount to extend and retract for exposing product information.

8. The information handling system of claim 1 wherein the bezel slot has a lip shaped to capture the pin, vertical movement in response to actuation of the lever releasing the pin from the lip.

9. The information handling system of claim 8 wherein the slot is formed in an edge extending back from the bezel end that slides between rail mount and housing.

10. A method for securing an information handling system housing, the method comprising:
securing the housing to a rack with a catch extending from a latch coupled at a side of the housing;
securing a bezel to a front of the housing with a pin extending from the latch towards the housing and engaged with a slot formed in an edge of the bezel extending back from the front of the housing;
raising a lever coupled to a front of a rail mount; and
translating the raising to lower the latch, thereby releasing the catch and the pin.

11. The method of claim 10 further comprising:
engaging the pin under a lip formed in the bezel slot; and
biasing the pin with a spring to remain in the lip, the raising the lever to lower the latch lowering the pin relative to the bezel slot to release the bezel.

12. The method of claim 11 further comprising:
inserting the bezel edge between the housing and the rail mount; and
engaging a cam shape of the slot against the pin to overcome the spring bias and engage the pin in the slot.

13. The method of claim 12 further comprising first and second pins, the bezel having a first slot to engage the first pin and a second slot to engage the second pin.

14. The method of claim 10 further comprising: coupling a lock to the rail mount and latch; and preventing movement of the latch relative to the rail mount to maintain the catch and the pin securely.

15. The method of claim 14 wherein the lock comprises a keyed barrel lock accepting a key at the rail mount.

16. A system for securing an information handling system to a rack, the system comprising:
a rail mount configured to couple to a side of the information handling system;
a latch coupled to the rail mount and having a catch extending to a rear side and configured to couple to the rack and a pin extending towards the information handling system and configured to engage a bezel; and
a lever coupled at a front of the rail mount and engaged with the latch, extending the lever out from the rail mount front face translating to the latch to move the catch and the pin to release the information handling system from the rack and the bezel from the information handling system front face.

17. The system of claim 16 further comprising a lock coupling the rail mount and latch to prevent movement of the latch that releases the information handling system from the rack and the bezel from the information handling system front face.

18. The system of claim 17 wherein the pin travels in a channel of the latch and biases to a locked position, the pin accepting insertion of the bezel when the latch is locked and engaging the bezel with the bias preventing removal of the bezel after pin engages the bezel.

19. The system of claim 18 wherein the lever engages the latch with a cam surface to translate upward and outward lever movement to vertically lower latch movement.

* * * * *